United States Patent
Hirakawa et al.

(10) Patent No.: US 7,670,752 B2
(45) Date of Patent: Mar. 2, 2010

(54) PHOTOSENSITIVE RESIN COMPOSITION, COMPOSITION FOR SOLDER RESIST, AND PHOTOSENSITIVE DRY FILM

(75) Inventors: Makoto Hirakawa, Nagoya (JP); Masao Takei, Minato-ku (JP); Hiroshi Niizuma, Nagoya (JP)

(73) Assignee: Toagosei Co., Ltd., Tokyo (JP)

( * ) Notice: Subject to any disclaimer, the term of this patent is extended or adjusted under 35 U.S.C. 154(b) by 0 days.

(21) Appl. No.: 11/995,111

(22) PCT Filed: Jul. 27, 2006

(86) PCT No.: PCT/JP2006/314921

§ 371 (c)(1),
(2), (4) Date: Mar. 6, 2008

(87) PCT Pub. No.: WO2007/015423

PCT Pub. Date: Feb. 8, 2007

(65) Prior Publication Data

US 2009/0068595 A1   Mar. 12, 2009

(30) Foreign Application Priority Data

Aug. 3, 2005 (JP) .............. 2005-226020
Dec. 27, 2005 (JP) .............. 2005-373645

(51) Int. Cl.
    *G03F 7/033* (2006.01)
(52) U.S. Cl. .............. 430/284.1; 430/277.1; 430/285.1; 430/271.1; 430/910; 522/92
(58) Field of Classification Search .................. None
    See application file for complete search history.

(56) References Cited

U.S. PATENT DOCUMENTS

| | | | |
|---|---|---|---|
| 6,297,294 B1 * | 10/2001 | Lazaar | 522/79 |
| 6,716,892 B1 * | 4/2004 | Mori et al. | 522/92 |
| 6,905,810 B2 * | 6/2005 | Yoshida et al. | 430/281.1 |
| 2003/0003398 A1 * | 1/2003 | Tamura et al. | 430/280.1 |
| 2003/0091926 A1 * | 5/2003 | Shelnut | 430/258 |
| 2004/0009428 A1 * | 1/2004 | Tamura et al. | 430/280.1 |
| 2007/0185287 A1 * | 8/2007 | Itagaki et al. | 525/524 |

FOREIGN PATENT DOCUMENTS

| | | |
|---|---|---|
| JP | 61-243869 | 10/1986 |
| JP | 8-292569 | 11/1996 |
| JP | 8-335767 | 12/1996 |
| JP | 9-54434 | 2/1997 |
| JP | 11-24263 | 1/1999 |
| JP | 2001-51415 | 2/2001 |
| JP | 2001-100410 | 4/2001 |
| JP | 2001-264977 | 9/2001 |
| JP | 2002-156754 | 5/2002 |
| JP | 2004-62057 | 2/2004 |
| JP | 2005-60662 | 3/2005 |
| WO | WO 2005012384 A1 * | 2/2005 |

OTHER PUBLICATIONS

RN 491570-81-1, Kayarad ZAR 1035, Registry file, ACS on STN, entered Feb. 18, 2003, One page.*
Derwent-ACC-No. 1997-090682, English abstract of JP 08292569 A, from 1997 Derwent week, Derwent Information LTD, 4 pages No Month GIven.*
English translation of JP, 08-292569, A (1997) from machine translation from AIPN Japan Patent Office National center for Industrial Property Information and Training, generated Mar. 15, 2009, 12 pages.*

* cited by examiner

*Primary Examiner*—Cynthia Hamilton
(74) *Attorney, Agent, or Firm*—Oblon, Spivak, McClelland, Maier & Neustadt, L.L.P.

(57) ABSTRACT

A photosensitive resin composition which is excellent in storage stability required for one-part type compositions and in processability required for dry-film formation and gives a cured product suitable for FPC substrates or suspension substrates for hard-disc which each retains essential properties required for solder resists, such as heat resistance, water resistance, and electrical-insulation reliability, and has flexibility and low polluting property. The composition comprises: a compound which has a carbon-carbon double bond and carboxy group and is obtained by allowing a bisphenol type epoxy compound and an unsaturated monocarboxylic acid to react and then allowing a polybasic acid anhydride to undergo addition reaction with part or all of the secondary hydroxy groups of the reaction product; a urethane (meth) acrylate compound having a structure derived from a polycarbonate polyol structure; another polymerizable compound having a carbon-carbon double bond; and a photopolymerization initiator.

7 Claims, No Drawings

PHOTOSENSITIVE RESIN COMPOSITION, COMPOSITION FOR SOLDER RESIST, AND PHOTOSENSITIVE DRY FILM

TECHNICAL FIELD

The present invention relates to a photosensitive resin composition, a composition for a solder resist and a photosensitive dry film. More specifically, the present invention relates to a photosensitive resin composition that leads to a pattern formation by exposure with light and development, and that leads to a cured product having heat resistance, water resistance, adhesive property to metal, electrical insulating property and flexibility; a composition for forming a solder resist film containing the same; and a photosensitive dry film (laminate) having a photosensitive film formed with the photosensitive resin composition. The present invention is useful as a resist film forming material, an insulating material or a solder resist film forming material in the field of electrical and electronic materials; specifically, flexible printed circuit boards (FPC boards) and suspension substrates for hard-disc.

BACKGROUND ART

Downsizing and low-profiling are being ahead in electronic components accompanying the demand for multiple functionalities, high integration, reduced thickness, size and weight in electronic devices. For example, wiring patterns on printed wiring boards are densified, and reductions in weight and thickness of a base material are being designed in suspension substrate for hard-disc.

Further, the demand is increasing for flexible printed wiring boards (FPC boards) that are thin and bendable in printed wiring boards.

Regarding a protective insulating film used in these applications, it is necessary for resist films themselves to be flexible in addition to high resolution and favorable insulating property that have been required. Moreover, a reduction in contaminants generated by the resist film is also desired.

Conventionally, a polyimide film referred to as "coverlay film" has often been used in order to satisfy the above demands. However, this coverlay film requires the use of an adhesive during lamination onto the base material, and producing openings in the joining parts of the elements is also necessary, which has the disadvantage of complicating the processing treatments. Thus, a "solder resist film" which is a photosensitive layer (film) excellent in processability and comparatively inexpensive relative to a polyimide film is used. Examples of a material used for forming this solder resist film include a resist ink composition comprising a reaction product between Novolak type epoxy acrylate and an epoxy compound as disclosed in JP-A S61-243869, a photosensitive resin composition comprising an epoxy acrylate having carboxyl group and an epoxy resin as disclosed in JP-A 2001-264977, and the like.

Although a cured product formed with the above-mentioned composition has superior hardness as a solder resist film, plasticity and flexibility are inferior. When a solder resist film is formed on the surface of a thin printed wiring board, thin suspension substrate for hard-disc, FPC board or the like, warping and torsion of the base material are sometimes generated, and cracking may be occurred in the cured product due to impact on mounting.

When such cracking is occurred, a solder sometimes adheres to unwanted areas during soldering, or absorption of moisture leads to corrosion of a conductor and insulation loss between conductors.

In addition, a cured product formed with a conventional composition has had problems with deterioration of insulation reliability due to hydrolysis under high-temperature and high-moisture conditions.

Moreover, a cured product has sometimes been formed using the above-mentioned composition while the curing temperature is reduced in order to minimize thermal contraction during the curing step. In such cases, however, there have been problems that an unreacted material or a low-molecular-weight impurity remains, outgassing level increases and product yield reduces.

On the other hand, a photocurable and thermosetting resin composition containing an epoxy compound having a defined structure as the primary component has been proposed to lead to a cured product having higher flexibility than conventional compositions that provide solder resist films in JP-A H9-54434.

However, there have been defects that a cured product formed with this composition has insufficient heat resistance and water resistance, and thermal degradation or absorption of moisture sometimes led to corrosion of a conductor and insulation loss between conductors. Furthermore, a photosensitive dry film is often utilized for a solder resist film having higher flexibility in particular. In the production of such photosensitive dry film, there have been problems that cissing occurs during coating onto the base material (support) due to high composition fluidity.

JP-A H8-335767 discloses that a large amount of inorganic filler is used as means for improving heat resistance and improving coatability onto a support. However, if inorganic filler is used in large quantities, there is a case where separation from the cured product sometimes occurs, which leads to product failure due to a particle.

Moreover, since an activating energy beam curable compound having carboxyl group and an epoxy resin readily react, photosensitive resin compositions containing these (JP-A S61-243869 and JP-A 2001-264977) are normally used as a two-part type composition. For this reason, it is necessary to mix the two liquids immediately prior to formation of a resist film, leading to problems with poor workability and storage stability of the composition for forming resist films.

DISCLOSURE OF THE INVENTION

Problems to be Solved by the Invention

As stated above, conventionally solder resist films and coverlay films are insufficient in terms of characteristics required for the production of suspension substrates for hard-disc, flexible printed circuit boards (FPC boards) and the like; specifically, plasticity of a cured part, flexibility, heat resistance and the like.

Additionally, one-part type compositions have also had problems with insufficient long-term storage stability. Further, sufficient coatability was not obtained in forming photosensitive layers (photosensitive films) for photosensitive dry films.

An objective of the present invention is to provide a photosensitive resin composition which is excellent in storage stability required for one-part type compositions and in processability required for formation of a photosensitive layer for photosensitive dry films and gives a cured product excellent in further flexibility and low polluting property; a composition for a solder resist and a photosensitive dry film that are capable of using for FPC substrates and suspension substrates for hard-disc.

Means for Solving Problems

The present inventors conducted thoroughgoing studies to resolve the above-mentioned problems. As a result, it was found that a composition comprising a compound having a carbon-carbon unsaturated double bond and carboxyl group, which is obtained by allowing a bisphenol type epoxy compound and an unsaturated monocarboxylic acid to react, and then allowing a polybasic acid anhydride to undergo addition reaction with part or all of secondary hydroxyl groups of the reaction product, a urethane (meth)acrylate and other polymerizable compound had superior storage stability, sufficient flexibility, persistently high levels of the above characteristics of a solder resist film as well as superior insulation reliability with no hydrolysis due to absorption of moisture, and the present invention was completed.

The photosensitive resin composition of the present invention is characterized in comprising: [A] a compound having a carbon-carbon unsaturated double bond and carboxyl group, which is obtained by allowing a bisphenol type epoxy compound and an unsaturated monocarboxylic acid to react, and then allowing a polybasic acid anhydride to undergo addition reaction with part or all of secondary hydroxyl groups of the reaction product; [B] a urethane (meth)acrylate compound having a structure derived from a polycarbonate-polyol structure; [C] a polymerizable compound having a carbon-carbon unsaturated double bond; and [D] a photopolymerization initiator.

The above-mentioned urethane (meth)acrylate compound [B] preferably has no carboxyl groups.

The above-mentioned polymerizable compound [C] has preferably three or more (meth)acryloyl groups.

The photosensitive resin composition of the present invention preferably comprises further a polymer [E] comprising a unit derived from at least one compound selected from the group consisting of (meth)acrylic acid and a (meth)acrylic acid ester.

The glass transition temperature of the polymer [E] is preferably in the range from 40° C. to 150° C.

The photosensitive resin composition preferably comprises further a compound [F] represented by the following general formula (1).

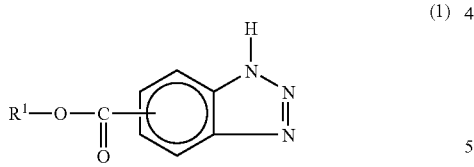

(1)

[In the formula, $R^1$ is hydrogen atom, an alkali metal atom, an alkyl group having carbon atoms of 1 to 6, or ammonium ion.]

The composition for a solder resist of the present invention is characterized in comprising the above-mentioned photosensitive resin composition.

In addition, the photosensitive dry film of the present invention is characterized in comprising a supporting layer and a photosensitive layer which is disposed on the supporting layer and is formed using the above-mentioned photosensitive resin composition.

EFFECT OF THE INVENTION

The photosensitive resin composition of the present invention has superior storage stability prior to curing, and the cured product thereof has superior flexibility and heat resistance, as well as favorable electrical insulation reliability under high-temperature and high-humid conditions. In addition, there are few contaminants generated by the cured product.

When the photosensitive resin composition of the present invention is processed, coatability is excellent when a photosensitive dry film, a photosensitive dry film resist and the like are subjected to production in addition to the above characteristics and storage stability for the photosensitive layer of the resulting photosensitive dry film is also excellent.

In particular, when the composition for a solder resist of the present invention is prepared by using the photosensitive resin composition of the present invention and a solder resist film is formed and then subjected to curing, superior flexibility is obtained while maintaining high levels of the fundamental characteristics of resolution, heat resistance, water resistance and electrical resistance.

Additionally, in the case where the photosensitive layer is a cured film having a prescribed pattern, the photosensitive dry film of the present invention has excellent flexibility, heat resistance, water resistance and electrical insulating property.

The photosensitive resin composition of the present invention, the composition for a solder resist of the present invention, and the photosensitive dry film of the present invention can thereby be used for thin printed wiring boards, FPC boards and suspension substrates for hard-disc.

BEST MODE FOR CARRYING OUT THE INVENTION

In the following, the present invention will be described in greater detail.

In the specification, "(meth)acrylate" means acrylate and/or methacrylate, and "(meth)acrylic acid" means acrylic acid and/or methacrylic acid. Additionally "(co)polymer" means homopolymer and/or copolymer.

1. Photosensitive Resin Composition

The photosensitive resin composition of the present invention is characterized in comprising: [A] a compound having a carbon-carbon unsaturated double bond and carboxyl group, which is obtained by allowing a bisphenol type epoxy compound and an unsaturated monocarboxylic acid to react, and then allowing a polybasic acid anhydride to undergo addition reaction with part or all of secondary hydroxyl groups of the reaction product (hereinafter, referred to as "component [A]"); [B] a urethane (meth)acrylate compound having a structure derived from a polycarbonate-polyol structure (hereinafter, referred to as "component [B]"); [C] a polymerizable compound having a carbon-carbon unsaturated double bond (hereinafter, referred to as "component [C]"); and [D] a photopolymerization initiator (hereinafter, referred to as "component [D]").

The respective components are described below.

1-1. Component [A]

This component [A] is a compound having a carbon-carbon unsaturated double bond and carboxyl group, which is obtained by allowing a bisphenol type epoxy compound and an unsaturated monocarboxylic acid to react (first step reaction), and then allowing a polybasic acid anhydride to undergo addition reaction with part or all of secondary hydroxyl groups of the reaction product (second step reaction). This compound has no particular limitations in terms of the number and sites of the carboxyl groups and the carbon-carbon unsaturated double bonds present in the compound.

Specific preferred examples include a bisphenol type epoxy (meth)acrylate compound having carboxyl group.

Examples of the above-mentioned bisphenol type epoxy resin include bisphenol-A type epoxy resin, bisphenol-F type epoxy resin, bisphenol-S type epoxy resin and the like.

These compounds may be used singly or in combination of two or more types thereof.

Examples of the above-mentioned unsaturated monocarboxylic acid include acrylic acid, methacrylic acid, crotonic acid, cinnamic acid and the like.

These compounds may be used singly or in combination of two or more types thereof.

Regarding the proportion between the above-mentioned bisphenol type epoxy resin and the above-mentioned unsaturated monocarboxylic acid upon reaction, carboxyl group in the latter is preferably in the range from 0.9 to 1.2 mole and more preferably from 0.95 to 1.05 mole based on 1 mole of epoxy group in the former.

The reaction (first step reaction) between the above-mentioned bisphenol type epoxy resin and the above-mentioned unsaturated monocarboxylic acid is preferably conducted in the presence of a catalyst and a diluent.

Examples of the catalyst include a quaternary ammonium salt such as trimethylbenzylammonium chloride, methyltriethylammonium chloride and tetrabutylammonium bromide; a tertiary amine such as triethylamine, tributylamine, N,N-dimethylbenzyl amine, N,N-dimethyl aniline and diazabicyclo octane; a phosphine such as triphenyl phosphine and tributyl phosphine; an imidazole such as 2-methyl imidazole, 1,2-dimethyl imidazole, 2-ethyl-4-methyl imidazole; and the like.

Examples of the diluent include an aromatic hydrocarbon such as toluene and xylene; a ketone such as methylethylketone and cyclohexanone; a glycol ether such as dipropyleneglycol dimethylether and dipropyleneglycol diethylether; an ester such as ethyl acetate, butyl acetate, butylcellosolve acetate, propyleneglycol monomethylether acetate and diethyleneglycol monoethylether acetate; an aliphatic hydrocarbon such as octane and decane; a petroleum-based solvent such as petroleum ether, petroleum naphtha, hydrogenated petroleum naphtha and solvent naphtha; and the like.

The reaction between the above-mentioned bisphenol epoxy compound and the above-mentioned unsaturated monocarboxylic acid is preferably carried out in a heated state. The preferred reaction temperature is in the range from 70° C. to 120° C. and more preferably from 80° C. to 110° C. If the reaction temperature is too high, then the above-mentioned unsaturated monocarboxylic acid may undergo thermal polymerization.

The above-mentioned polybasic acid anhydride used in the second step reaction may be a saturated or unsaturated polybasic acid anhydride and examples include maleic anhydride, succinic anhydride, itaconic anhydride, tetrahydrophthalic anhydride, trimellitic anhydride, pyromellitic anhydride and the like.

These compounds may be used singly or in combination of two or more types thereof.

The preferable proportion in the reaction between the reaction product obtained in the first step reaction and the polybasic acid anhydride is in the range from 0.1 to 1.0 mole of the polybasic acid anhydride with respect to 1 mole of the secondary hydroxyl groups present in the above-mentioned reaction product. When the proportion is in this range, addition reaction can be conducted in which the above-mentioned polybasic acid anhydride reacts with part or all of the above-mentioned secondary hydroxyl groups. The more preferable proportion is in the range from 0.2 to 0.9 mole. If the proportion of the polybasic acid anhydride to be used is less than 0.1 mole, the alkali developability of a film obtained using the photosensitive resin composition of the present invention may be decreased. On the other hand, if the proportion is larger than 1.0 mole, an unreacted polybasic acid anhydride may remain and the unreacted polybasic acid anhydride may crystallize. Additionally, when a photosensitive resin composition is prepared using the final product in the above reaction, the reaction between the residual hydroxyl groups and the unreacted polybasic acid anhydride may be conducted during storage in many cases and the storage stability of the composition may be reduced.

The reaction (second step reaction) between the reaction product obtained in the first step reaction and the above-mentioned polybasic acid anhydride is preferably carried out in a heated state. The preferable reaction temperature is in the range from 70° C. to 120° C. and more preferably from 80° C. to 110° C. If the reaction temperature is too high, the reaction product may be a gel.

The partial structure of the above-mentioned component [A] in the present invention is as follows.

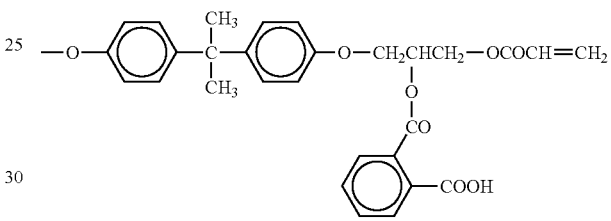

The acid value of the above-mentioned component [A] is preferably in the range from 10 to 50 (KOH mg/g) and more preferably from 20 to 40 (KOH mg/g). The acid value of this component [A] can be adjusted in accordance with variation in the used amount of the polybasic acid anhydride in the second step reaction.

The polystyrene-converted weight-average molecular weight measured by GPC is preferably in the range from 1,000 to 100,000 and more preferably from 2,000 to 50,000.

The above-mentioned component [A] may be used singly or in combination of two or more types thereof.

1-2. Component [B]

This component [B] is a urethane (meth)acrylate having a structure derived from a polycarbonate-polyol structure.

The above-mentioned component [B] may be used commercial ones. A reaction product among a polycarbonate polyol, a polyisocyanate and a hydroxyl group-containing (meth)acrylate having hydroxyl group and the like may be used.

The above-mentioned polycarbonate polyol is not particularly limited so long as it is a polyol having a carbonate bond and two or more hydroxyl groups. A reaction product between a carbonate ester having an alkylene group, an alkyl group, an aromatic hydrocarbon group, a cycloparaffin-based hydrocarbon group and the like, and a polyol having an alkylene group, an alkyl group, an aromatic hydrocarbon group, a cycloparaffin-based hydrocarbon group and the like may also be used.

Examples of the carbonate ester include ethylene carbonate, dimethyl carbonate, diethyl carbonate, diphenyl carbonate, ethylene carbonate, propylene carbonate, dicyclohexyl carbonate and the like. These may be used singly or in combination of two or more types thereof.

Additionally, examples of the polyol include 1,6-hexane diol, 1,4-cyclohexane dimethanol, 3-methyl-1,5-pentane diol, 1,5-pentane diol, polyoxyethylene diol, polyoxypropylene diol, polyoxybutylene diol, polycaprolactone diol, trimethylhexane diol, 1,4-butane diol and the like.

These may be used singly or in combination of two or more types thereof. Two or more compounds differing molecular weights and conformation each other may be used.

The above-mentioned polyisocyanate is not particularly limited so long as it has two or more isocyanate groups. An example thereof includes an aromatic diisocyanate compound, an aliphatic diisocyanate compound, and trimer thereof, and the like.

Examples of the above-mentioned aromatic diisocyanate compound include tolylene diisocyanate, diphenylmethane diisocyanate, xylylene diisocyanate, 1,5-naphthalene diisocyanate, 1,6-phenylene diisocyanate, 1,4-phenylene diisocyanate and the like. These may be used singly or in combination of two or more types thereof.

Examples of the above-mentioned aliphatic diisocyanate compound include isophoron diisocyanate, 1,6-hexamethylene diisocyanate, hydrogenated diphenylmethane diisocyanate, hydrogenated tolylene diisocyanate, hydrogenated xylylene diisocyanate, 1,3-diisocyanate cyclohexane, 1,4-diisocyanate cyclohexane, dicyclohexylmethane-4,4'-diisocyanate, m-tetramethylxylene diisocyanate, p-tetramethylxylene diisocyanate, 1,4-tetramethylene diisocyanate, 1,12-dodecamethylene diisocyanate, 2,2,4-trimethylcyclohexane diisocyanate, 2,4,4-trimethylcyclohexane diisocyanate, 2,4,4-trimethylhexamethylene diisocyanate and the like. These may be used singly or in combination of two or more types thereof.

The above-mentioned hydroxyl group-containing (meth)acrylate is not particularly limited so long as it is a (meth)acrylate having at least one hydroxyl group.

Examples of the hydroxyl group-containing (meth)acrylate include a hydroxyalkyl (meth)acrylate such as hydroxyethyl (meth)acrylate and hydroxypropyl (meth)acrylate; a mono(meth)acrylate of a divalent alcohol such as ethyleneglycol mono(meth)acrylate, propyleneglycol mono(meth)acrylate, diethyleneglycol mono (meth)acrylate, dipropyleneglycol mono (meth)acrylate, polyethyleneglycol mono (meth)acrylate, polypropyleneglycol mono(meth)acrylate and neopentylglycol mono(meth)acrylate; a mono(meth) acrylate of a trivalent alcohol such as trimethylolpropane mono(meth)acrylate; a di(meth)acrylate of a trivalent alcohol such as trimethylol propane diacrylate and glycerin di(meth)acrylate; a mono(meth)acrylate of an alcohol having four or more valences such as pentaerythritol mono(meth)acrylate and dipentaerythritol mono(meth)acrylate; a di(meth)acrylate of an alcohol having four or more valences such as pentaerythritol di(meth)acrylate and dipentaerythritol di(meth)acrylate; pentaerythritol tri(meth)acrylate, dipentaerythritol hexa(meth)acrylate, ditrimethylolpropane hexa(meth)acrylate and the like. These may be used singly or in combination of two or more types thereof. Additionally, hydroxyethyl (meth)acrylate and hydroxypropyl (meth)acrylate are preferable among these.

The component [B] is preferably a urethane (meth)acrylate obtained by a reaction between a total of 0.9 to 1.1 mole of hydroxyl groups in the above-mentioned polycarbonate polyol and the above-mentioned hydroxyl-group-containing (meth)acrylate with respect to 1 mole of isocyanate groups in the above-mentioned polyisocyanate, and a urethane (meth) acrylate obtained by a reaction between equivalent molar ratio of the above-mentioned isocyanate groups and the above-mentioned hydroxyl groups is more preferable.

The above-mentioned component [B] is preferably a urethane (meth)acrylate having no carboxyl groups because it leads to an excellent water resistance and insulation reliability.

The polystyrene-converted weight-average molecular weight of the component [B] as determined by GPC is preferably in the range from 2,000 to 50,000 and more preferably from 5,000 to 20,000.

The component [B] may be used singly or in combination of two or more types thereof.

In the case of using a urethane (meth)acrylate having a polyester-polyol structure, hydrolysis readily occurs when the resulting cured film absorbs moisture, and the electrical insulation reliability is reduced in some cases.

The content ratio of the components [A] and [B] in the photosensitive resin composition of the present invention are preferably in the range from 20% to 90% by weight and in the range from 80% to 10% by weight, and more preferably from 40% to 80% by weight and from 60% to 20% by weight, respectively, based on 100% by weight of the total of these components. If the content of the component [A] is less than 20% by weight, the developability in an aqueous alkali solution is not sufficient. On the other hand, if the content is more than 90% by weight, flexibility of the cured film is sometimes deteriorated.

1-3. Component [C]

This component [C] is a compound other than the above-mentioned components [A] and [B], and is a polymerizable compound which has one or more carbon-carbon unsaturated double bonds, which has no structure derived from both of carboxyl group and an epoxy compound, and which has no structure derived from both of urethane bond and a polycarbonate polyol. The preferable component [C] is a compound having carbon atoms of 4 to 40, and more preferably a compound having carbon atoms of 4 to 30.

Examples of the above-mentioned carbon-carbon unsaturated double bonds include acryloyl group, methacryloyl group, allyl group, vinyl group and the like.

Examples of the polymerizable compound having one carbon-carbon unsaturated double bond include a monofunctional (meth)acrylate such as methyl (meth)acrylate, butyl (meth)acrylate, 2-ethylhexyl (meth)acrylate, hydroxyethyl (meth)acrylate and hydroxypropyl (meth)acrylate; a vinyl compound such as styrene; an allyl compound such as allyl phenol, and the like. These may be used singly or in combination of two or more types thereof.

Examples of the polymerizable compound having two carbon-carbon unsaturated double bonds include a di(meth) acrylate compound such as 1,3-butanediol di(meth)acrylate, diethyleneglycol di(meth)acrylate, pentaerythritol diacrylate monostearate, polyethyleneglycol di(meth)acrylate and polypropyleneglycol di(meth)acrylate; a divinyl compound such as divinylbenzene; a diallyl compound such as diallyl phthalate, and the like. These may be used singly or in combination of two or more types thereof.

Further, examples of the polymerizable compound having three or more carbon-carbon unsaturated double bonds include trimethylolpropane tri(meth)acrylate, pentaerythritol tri(meth)acrylate, dipentaerythritol penta(meth)acrylate, dipentaerythritol hexa(meth)acrylate, triallylisocyanurate and the like. These may be used singly or in combination of two or more types thereof.

The above-mentioned component [C] is preferably a compound having three or more carbon-carbon unsaturated double bonds. The compound leads to a cured product having a higher insulating reliability.

The above-mentioned component [C] may be used singly or in combination of two or more types thereof.

The content of the above-mentioned component [C] in the photosensitive resin composition of the present invention is preferably in the range from 2 to 50 parts by weight and more preferably from 5 to 25 parts by weight based on 100 parts by weight of the total of the components [A] and [B]. If the content of the component [C] is less than 2 parts by weight, crosslinking density of the cured product may be insufficient, and solder heat resistance and insulation reliability sometimes lower. On the other hand, if the content is more than 50 parts by weight, flexibility of the cured product may be deteriorated.

The average acryloyl equivalent of the mixture consisting of the components [A], [B] and [C] in the photosensitive resin composition of the present invention is preferably in the range from 0.2 to 2.4 g/meq and more preferably from 0.5 to 1.2 g/meq.

In the case where the components [A], [B] and [C] are (meth)acrylates, adjusting concentrations of (meth)acryloyl group in each compound leads to a resist film capable of forming a cured product having superior heat resistance, plasticity and flexibility.

1-4. Component [D]

This component [D] is a compound that can initiate radical polymerization when irradiated with ultraviolet beam or the like. Specific examples include benzoin; a benzoin alkyl ether such as benzoin methyl ether, benzoin ethyl ether and benzoin isopropyl ether; an acetophenone such as acetophenol, 2,2-dimethoxy-2-acetophenone, 2,2-diethoxy-2-acetophenone and 1,1-dichloroacetophenone; an anthraquinone such as 2-methyl anthraquinone, 2-ethyl anthraquinone, 2-tert-butyl anthraquinone, 1-chloro anthraquinone and 2-amyl anthraquinone; a thioxanthone such as thioxanthone, 2-chloro thioxanthone, an 2-alkylthio thioxanthone and a 2,4-dialkyl thioxanthone; a benzophenone such as benzophenone, 4-chloro benzophenone, 4,4'-dichloro benzophenone and 4,4'-bisdimethylamino benzophenone; and the like.

The above-mentioned component [D] may be used singly or in combination of two or more types thereof.

In the photosensitive resin composition, the content of the component [D] is preferably in the range from 0.5 to 10 parts by weight, and more preferably from 1 to 5 parts by weight based on 100 parts by weight of the total of the components [A] and [B]. If the content of the component [D] is less than 0.5 part by weight, reaction by exposure may not be initiated. Further, mechanical strength of the resultant cured product may be lowered, delamination of the cured product sometimes occurs during developing step and the resultant pattern may be a deviant shape. On the other hand, if the content is more than 10 parts by weight, a photopolymerization initiator that was not used upon exposure may be left in the cured product and physical properties such as heat resistance of the cured product may be lowered.

1-5. Other Components

The photosensitive resin composition of the present invention contains the components [A], [B], [C], and [D] as essential components, but other components may also be blended as necessary.

(1) Component [E]

This component [E] is a (co)polymer comprising a unit (hereinafter, referred to as "unit (e1)") derived from at least one compound selected from the group consisting of (meth) acrylic acid and a (meth)acrylic acid ester.

The (meth)acrylic acid ester is not particularly limited so long as it is a compound having at least one carbon-carbon unsaturated double bond. In addition, the (meth)acrylic acid ester may have hydroxyl group, amino group, epoxy bond or the like. An example thereof includes an alkyl (meth)acrylate such as methyl (meth)acrylate, ethyl (meth)acrylate, n-propyl (meth)acrylate, n-butyl (meth)acrylate, isobutyl (meth)acrylate, n-hexyl (meth)acrylate and 2-ethylhexyl (meth)acrylate; an arylalkyl (meth)acrylate such as phenyl (meth)acrylate and benzyl (meth)acrylate; a hydroxyalkyl (meth)acrylate such as hydroxyethyl (meth)acrylate and hydroxypropyl (meth)acrylate; glycidyl (meth)acrylate, and the like.

These monomers may be used singly or in combination of two or more types thereof.

Additionally, the component [E] may be a copolymer comprising a unit (hereinafter, referred to as "unit (e2)") as necessary in addition to the above-mentioned unit (e1).

Examples of the monomer forming the above-mentioned unit (e2) include a carboxylic acid vinyl ester such as vinyl acetate and vinyl propionate; a cyanidated vinyl compound such as (meth)acrylonitrile and α-chloroacrylonitorile; an aromatic vinyl compound such as styrene, α-methyl styrene and vinyl toluene; a vinyl group-containing hetero compound such as N-vinyl pyrollidone, vinyl pyridine and vinyl imidazole; an unsaturated carboxylic acid except (meth)acrylic acid, such as crotonic acid, maleic acid and fumaric acid, and alkylester thereof; an unsaturated amide compound such as (meth)acrylamide and α-chloroacrylamide; and the like. These monomers may be used singly or in combination of two or more types thereof.

Accordingly, the above-mentioned component [E] may be used a (co)polymer comprising one or more of the above-mentioned unit (e1) and a copolymer comprising one or more of the above-mentioned unit (e1) and one or more of the above-mentioned unit (e2). In the latter case, total content of the above-mentioned unit (e1) constituting the component [E] is preferably in the range from 20% to 95% by weight, and more preferably in the range 30% to 90% by weight.

The above-mentioned component [E] is preferably a polymer having no carbon-carbon unsaturated double bonds, however, a polymer in which a polymerizable unsaturated bond is further introduced into a polymer comprising the above-mentioned unit (e1) may be used. In the case of introducing a polymerizable unsaturated bond into the above-mentioned polymer, a method for using a variety of reactions may be applied. Example includes a method for applying a reaction between a carboxylic acid and an epoxy wherein a polymer having carboxyl group is used and is perform additional reaction of a glycidyl group-containing unsaturated compound with carboxyl group to introduce a polymerizable unsaturated bond.

The glass transition temperature of the above-mentioned component [E] is preferably in the range from 40° C. to 150° C. When a (co)polymer having the above-mentioned glass temperature is used, heat resistance of a cured product may be improved. When the cured product is used as a resist film, insulation reliability, plating liquid resistance and solder heat resistance may be improved.

In the present invention, the term "glass transition temperature" is a temperature at which the viscoelastic loss tangent (tan δ) is at a maximum in measurements carried out using a viscoelasticity spectrometer.

The polystyrene-converted number-average molecular weight of the above-mentioned component [E] is preferably in the range from 1,000 to 300,000 and more preferably from 30,000 to 150,000, which is measured by GPC. When the component [E] having the above-ranging number-average molecular weight is used, favorable alkali developability may be obtained in the evaluation of a composition for a solder resist. In addition, heat resistance of the cured product is superior, coatability during photosensitive dry film processing is improved, and cissing is also inhibited.

The acid value of the above-mentioned component [E] is preferably in the range from 50 to 300 mgKOH/g. When the component [E] having the above-ranging acid value is used, favorable alkali developability may be obtained in the evaluation of a composition for a solder resist.

The above-mentioned component [E] may be used singly or in combination of two or more types thereof.

The formulating amount of the above-mentioned component [E] is preferably in the range from 0.5 to 50 parts by weight and more preferably from 1 to 15 parts by weight with respect to 100 parts by weight of the total of the above-mentioned components [A] and [B]. When the content of the above-mentioned component [E] is in the above range, improving effect of heat resistance for the cured product may be sufficient. The coatability for processing a photosensitive dry film may be improved and cissing may be inhibited, and film-formability may be superior. In addition, the alkali developability may be improved in the evaluation of a composition for a solder resist.

(2) Component [F]

This component [F] is an adhesion promoter that is used in order to improve adhesive property to a base material, specifically, adhesive property to copper. Examples of the adhesion promoter include a compound represented by the following general formula (1).

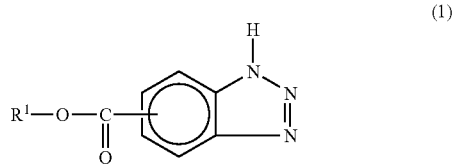

(1)

[In the formula, $R^1$ is hydrogen atom, an alkali metal atom, an alkyl group having carbon atoms of 1 to 6, or ammonium ion.]

In the case where $R^1$ is an alkali metal atom in the above general formula (I), example thereof includes metal such as lithium, sodium and potassium, and the like. Examples of the alkyl group include methyl group, ethyl group, propyl group, butyl group, pentyl group or hexyl group. This alkyl group may be linear or branched. Examples of the ammonium ion include tetramethyl ammonium ion, tetraethyl ammonium ion, trimethylphenyl ammonium ion, N,N-dimethylpiperidinium ion and the like.

Specific examples of the above general formula (1) include 4-benzotriazole carboxylic acid, sodium 4-benzotriazole carboxylate, 4-benzotriazole carboxylic acid methyl ester, 5-benzotriazole carboxylic acid ethyl ester and the like.

The above-mentioned component [F] may be used singly or in combination of two or more types.

The formulating amount of the above-mentioned component [F] is preferably in the range from 0.2 to 50 parts by weight and further preferably from 2 to 20 parts by weight with respect to 100 parts by weight of the total of the components [A] and [B]. When the content of the above-mentioned component [F] is within the above range, adhesive property to a base material can be sufficiently improved and a cured film excellent in heat resistance can be obtained. In addition, solder heat resistance of a resist pattern (resist film) that is formed on the surface of a base material made of, for instance, copper can be remarkably improved, and the alkali developability can also be improved.

(3) Component [G]

This component [G] is a thermal polymerization catalyst.

Examples of the above-mentioned component [G] include an organic peroxide, an azobis-based compound and the like. Of these compounds, the organic peroxide is preferred because it has favorable storage stability due to their high decomposition initiation temperature and generates little low-molecular-weight volatile components as a result of decomposition. Among organic peroxides, a dialkyl peroxide is preferred, a specific example thereof includes dicumyl peroxide, tert-butylcumyl peroxide, 2,5-dimethyl-2,5-di(tert-butyl peroxy)hexane, 2,5-dimethyl-2,5-(t-butyl peroxy)hexine and the like.

The above-mentioned component [G] may be used singly or in combination of two or more types.

The formulating amount of the above-mentioned component [G] is preferably in the range from 0.5 to 10 parts by weight with respect to 100 parts by weight of the total of the components [A] and [B]. When the content of component [G] is in the above range, it is possible to improve storage stability and heat resistance of the resultant cured product.

(4) Component [K]

This component [K] is a sensitizer.

Examples of the above-mentioned component [K] include N,N-dimethylaminobenzoic acid ethyl ester, N,N-dimethylaminobenzoic acid isoamino ester, triethylamine, diethylthioxanthone, triethanolamine and the like.

The above-mentioned sensitizer is commercially available and "Nissocure EPA", "Nissocure EMA", "Nissocure IAMA" and the like produced by Shinniso Kako K.K., "Kayacure EPA", "Kayacure DETX", "Kayacure DMBI" and the like produced by Nippon Kayaku Co., Ltd., "DABA" produced by Osaka Organic Chemistry Industry Ltd., and the like.

The above-mentioned component [K] may be used singly or in combination of two or more types.

The formulating amount of the above-mentioned component [K] is preferably in the range from 0.5 to 10 parts by weight with respect to 100 parts by weight of the total of the components [A] and [B]. When the content of the above-mentioned component [K] is in the above range, reaction rate for ultraviolet hardening is sufficient and storage stability can be improved.

(5) Additives

The photosensitive resin composition of the present invention may be further formulated a leveling agent, an antifoaming agent, a coloring agent, an ion scavenger and the like. Examples of the leveling agent include a fluorine-based surfactant, a silicone-based surfactant and the like. Examples of the antifoaming agent include a fluorine-based surfactant, a silicone-based surfactant and the like. Examples of the coloring agent include phthalocyanine blue, phthalocyanine green, carbonblack, disazoyellow, crystal violet, titanium oxide and the like. Examples of the ion capture include a bismuth compound, an antimony compound, a magnesium compound, an aluminum compound, a zirconium compound, a calcium compound, a titanium compound, a tin-based compound and the like.

The photosensitive resin composition of the present invention is preferably one comprising no compounds having epoxy group.

When the photosensitive resin composition of the present invention requires additional improvement in heat resistance and chemical resistance for the cured product but does not require high-level storage stability, a compound having epoxy group (hereinafter referred to as "other epoxy compound") may also be blended.

Specific examples of the other epoxy compound include a cresol novolak epoxy resin, a phenol novolak epoxy resin, an epoxy resin having isocyanuric acid structure, a bisphenol-A type epoxy resin and the like.

The other epoxy compound is preferably a compound having two or more epoxy groups.

When the other epoxy compound is used, an amine-based hardener, an acid-based hardener, an acid anhydride-based hardener and the like are preferably incorporated.

In the photosensitive resin composition of the present invention, content of an inorganic filler is preferably 1% by weight or less. If the content of the inorganic filler exceeds 1% by weight, the particle amount generated from the cured product will be increased, causing product failure in some cases.

When the photosensitive resin composition of the present invention requires additional improvement in heat resistance for the cured product, coatability during fabrication of a photosensitive dry film and the like but does not require the particle amount reduction, the inorganic filler can be formulated in an amount of 1% by weight or more.

Examples of the inorganic filler include barium sulfate, barium titanate, silicon oxide powder, fine powdery silicon oxide, silica, talc, clay, magnesium carbonate, calcium carbonate, aluminum oxide, aluminum hydroxide, mica and the like.

The photosensitive resin composition of the present invention may contain a diluent of publicly known organic solvent for controlling viscosity, drying performance and the like. Examples of this organic solvent include a ketone such as methylethylketone and cyclohexanone; an aromatic hydrocarbon such as toluene and xylene; an alcohol such as methanol, isopropanol and cyclohexanol; an alicyclic hydrocarbon such as cyclohexane and methylcyclohexane; a petroleum-based solvent such as petroleum ether and petroleum naphtha; a cellosolve such as cellosolve and butyl cellosolve; a carbitol such as carbitol and butyl carbitol; an acetic acid ester such as ethyl acetate, butyl acetate, cellosolve acetate, butyl cellosolve acetate, carbitol acetate and butyl carbitol acetate; and the like.

1-6. Preparation Method for Photosensitive Resin Composition

The photosensitive resin composition of the present invention can be produced by stirring and mixing the above-mentioned components [A] to [D], or components [A] to [D] and other component that is formulated if necessary, according to the normal method.

2. Use of the Photosensitive Resin Composition

The photosensitive resin composition of the present invention can be used in a form of a liquid or in a form of a dry film.

2-1. Use of Liquid Photosensitive Resin Composition

In the case of using in the form of a liquid, a composition in which a solvent having high boiling temperature is added may be used as necessary. Examples of the solvent having high boiling temperature include ethyl cellosolve, butyl cellosolve, butyl carbitol, ethyl cellosolve acetate, butyl cellosolve acetate, ethylcarbitol acetate, butylcarbitol acetate and the like.

When the above-mentioned photosensitive resin composition is used in the form of a liquid, a method involving coating or printing the composition onto a base material, drying the coated film by heating, irradiating with an activating energy beam and further heating, and the like are conducted.

Examples of the above-mentioned base material include a metal such as silicon, aluminum, iron, nickel and copper; a glass; a plastic such as polyethylene terephthalate, polyimide and polycarbonate; a composite base material such as glass epoxy substrate; and the like.

Examples of the application apparatus used for coating the composition onto the above-mentioned base material include a spin coater, a roll coater, a curtain coater and the like. The film thickness can be appropriately set in accordance with objectives, but is preferably in the range from 1 to 100 μm.

When the above-mentioned photosensitive resin composition is solvent-based containing the above-mentioned diluent, the diluent is evaporated off by heating after coating or printing the composition. Examples of the heating apparatus used in such a case include an oven, a heatable plate and the like. The heating conditions may be appropriately set in accordance with objectives and the type of composition to be used. The heating temperature is preferably in the range from 70° C. to 120° C., and the heating time is preferably in the range from 5 to 30 minutes.

After that, the resultant film is subjected to irradiation (exposure) with an activating energy beam through open sections of the photomask or the like which has a specific pattern. The sections receiving the light of the activating energy beam are cured to form a cured film.

Examples of the activating energy beam used for curing of the film include an electron beam, an ultraviolet beam and the like. An ultraviolet beam is preferably used because an inexpensive apparatus can be used.

The irradiation conditions of the activation energy beam may be appropriately set in accordance with the constituent components of the film and the objectives, but are preferably in the range from 10 to 5,000 mJ/cm$^2$.

Subsequently, alkali development is carried out to remove the unexposed sections (uncured sections) after irradiation with the activating energy beam.

The alkali development conditions may be appropriately selected in accordance with the above-mentioned constituent components of the film and the objectives, but a dilute alkali aqueous solution is normally used. Examples of the dilute alkali aqueous solution include a 0.5% to 2% by weight of sodium carbonate aqueous solution.

The developing temperature is preferably in the range from 15° C. to 50° C., and the developing time is preferably in the range from 15 to 180 seconds.

In the case where a resist film is formed on a printed wiring board to which a copper foil is laminated, it is preferable, after polishing the surface of the copper foil, to form the resist film prior to formation of an oxide film on the copper foil surface, because this will improve adhesion. Additionally, when a resist film is formed after subjecting the surface of the copper foil to an oxidation treatment or roughening treatment on the copper foil surface for nonuniformities, adhesion can be further improved.

2-2. Composition for Solder Resist

The composition for a solder resist of the present invention is characterized in comprising the above-mentioned photosensitive resin composition of the present invention. That is to say, the composition for a solder resist of the present invention may be composed simply of the above-mentioned photosensitive resin composition of the present invention, or be a composition that contains further other components. According to the composition for a solder resist of the present invention, a printed wiring board having a solder resist film can be readily produced. When this solder resist film is used, a cured film is normally formed on the sections of an article having a conductive pattern other than the sections to which a solder is to be affixed (normally, the entire surface). Accordingly, attachment of a solder to unwanted sections can be prevented upon soldering, and it is also possible to prevent oxidation or corrosion as a result of exposure of the conductive pattern directly to air. Soldering is carried out using a lead-free material such as a tin-bismuth alloy and a tin-zinc alloy.

When the composition for a solder resist of the present invention is used, coating is conducted at a desired thickness onto a printed wiring board having a prescribed conductor pattern, and the diluent is removed by heating. After that, for example, the surfaces other than land sections to which a solder has affixed to the conductive pattern are irradiated with an activating energy beam, and alkali development is carried out. In order to additionally improve physical properties, more thorough curing can be carried out by heating or irradiation with an activating energy beam, as necessary. The heating method and heating conditions may be appropriately determined in accordance with objectives and the constituent components of the film, but the heating temperature is preferably in the range from 100° C. to 250° C., and the heating time is preferably in the range from 5 minutes to 5 hours. The irradiation conditions for the activating energy beam may be also set appropriately in accordance with objectives and the constituent components of the film, but is preferably in the range from 10 to 5,000 mJ/cm$^2$.

2-3. Photosensitive Dry Film

The photosensitive dry film of the present invention is characterized in comprising a supporting layer and a photosensitive layer which is disposed on the supporting layer and is formed using the above-mentioned photosensitive resin composition of the present invention. The thickness of the photosensitive layer is usually in the range from 1 to 200 μm.

Examples of methods for the production of the photosensitive dry film of the present invention include a method where a composition is coated on a resin film (supporting layer) of a polyester resin, polyolefin resin or the like, drying is conducted by heating or the like, and forming a photosensitive layer. The composition used for the production may be a composition in which a solvent suitable for application to the above-mentioned resin film is previously added. Examples of the solvent include a compound having a comparatively low boiling temperature such as methylethylketone, ethyl acetate, butyl acetate, methanol and ethanol. This solvent must be evaporated under a heating condition (temperature and time) at which the components in the composition will not polymerize after coating.

After forming the photosensitive layer, a photosensitive dry film having a cover film can be produced by a method in which a polyolefin film of polypropylene or the like is laminated as a cover film, or the other method. The cover film is normally separated at the time of use of the photosensitive dry film of the present invention, and thus the photosensitive layer will be protected and superior storage stability will be provided until such time.

When an insulating protective film or the like is formed on a printed wiring board using the photosensitive dry film of the present invention, the photosensitive layer of the photosensitive dry film and the printed wiring board are glued together at first. In the case where the photosensitive dry film has a cover film on the photosensitive layer, it is brought into contact with the printed wiring board after peeling the cover film to expose the photosensitive layer.

Subsequently, pressing or thermocompression is applied to seal the two as necessary, and a cured film (insulating protective film) having a prescribed pattern can be formed in the same manner as above.

The photosensitive resin composition of the present invention, the composition for a solder resist of the present invention and the photosensitive dry film of the present invention are useful as a resist film forming material, an insulating material or a solder resist film forming material in the field of electrical and electronic materials; specifically, FPC boards, suspension substrates for hard-disc, and the like.

When a solder resist film is formed on the outermost layer of an FPC board, for example, curling will be slight, occurrence of cracking will be minimized, and protection of the conductive pattern will persist, even when there is high stress applied during bending. Consequently, even if the base material has a complicated shape, the cured film will have superior flexibility, adhesive property and electrical insulating property, and workability will also be superior.

In addition, the photosensitive resin composition of the present invention can also be used for an interlayer insulating layer in a multilayered printed wiring board.

EXAMPLES

Hereinafter, examples will be given in order to explain the present invention in more detail. It is noted that "%" means % by weight.

1. Starting Components for Composition 1-1. Component [A]

An epoxy acrylate resin obtained by the following method was used.

950 grams (5.0 epoxy equivalent) of a bisphenol-A type epoxy resin (trade name "EPIKOTE 828", manufactured by Japan Epoxy Resins Co., Ltd.) and 450 grams of toluene as a solvent were introduced into a four-necked flask provided with a temperature gauge, a stirrer and a condenser, and the system was heated to 110° C. to obtain a uniform solution. 360 grams (5.0 carboxyl equivalent) of acrylic acid, 0.50 gram of phenothiazine as a polymerization inhibitor and 10 grams of tetrabutylammonium bromide as a catalyst were then added to this solution, and a reaction was allowed to occur at 110° C. while bubbling air and stirring to produce an epoxy acrylate. The consumption ratio of acrylic acid calculated based on the acid value was about 100%.

Subsequently, 220 grams (1.5 mole) of phthalic anhydride was added to the epoxy acrylate solution obtained above, and the system was heated to 110° C. to completely dissolve the phthalic anhydride. After that, a reaction between epoxy acrylate and phthalic anhydride was conducted for 3 hours while stirring. 1,040 grams of butyl cellosolve was added to the reaction solution, and 300 grams of toluene was removed under reduced pressure to obtain a solution containing 60% of an epoxy acrylate resin having a carbon-carbon double bond and carboxyl group.

1-2. Component [B]

A urethane acrylate obtained by the following method was used.

64 grams (0.37 mole) of tolylene diisocyanate and about 200 ppm of dibutyl tin dilaurate were introduced into a four-necked flask provided with a temperature gauge, a stirrer and a condenser, and the system was heated to about 70° C. After that, about 390 grams (0.20 mole) of a polycarbonate diol (trade name "Carbonate diol", manufactured by TOAGOSEI CO., LTD., weight-average molecular weight; about 2,000) that was a reaction product of ethylene carbonate and 1,6-hexanediol was added slowly while maintaining this temperature and stirring, and a reaction was allowed to occur for 1 hour.

Subsequently, about 200 ppm of dibutyl tin dilaurate was added while maintaining the temperature of the solution at about 70° C. and stirring, and about 48 grams of 2-hydroxyethyl acrylate was added slowly to bring about a reaction. The reaction was analyzed by infrared absorption spectrometry, and the reaction was continued until it was confirmed that the characteristic absorption of —NCO group disappeared.

As a result, about 500 g of a urethane acrylate having a structure derived from polycarbonate polyol structures was obtained as a rubbery solid.

1-3. Component [C]

Three compounds below were used. (C-3) was used for comparison.

(C-1): Composition of dipentaerythritol pentaacrylate and dipentaerythritol hexaacrylate (trade name "ARONIX M-400" manufactured by TOAGOSEI CO., LTD.)

(C-2): Pentaerythritol diacrylate monostearate (trade name "ARONIX M-233" manufactured by TOAGOSEI CO., LTD.)

(C-3): Polyester-polyol type urethane acrylate (trade name "U-200AX" manufactured by SHIN-NAKAMURA CHEMICAL CO., LTD., number-average molecular weight 13,000)

1-4. Component [D]

2-Methyl-[4-(methylthio)phenyl]-2-morpholino-1-propanone (trade name "IRGACURE 907" manufactured by Ciba Speciality Chemicals Inc.) was used.

1-5. Component [E]

An acrylic copolymer obtained by the following method was used.

400 grams of toluene as a solvent was introduced into a flask provided with a temperature gauge, a stirrer and a condenser, and the system was heated to 80° C. 500 grams of a monomer mixture composed of 40% of methyl methacrylate, 20% of methacrylic acid and 40% of acrylonitrile and 3.5 grams of azobisisobutyronitrile were then added dropwise over a period of 3 hours while maintaining this temperature, bubbling nitrogen into the flask and stirring. After completion of dropwise addition, the system was heated for 2 to 4 hours to continue polymerization. Subsequently, the reaction solution was diluted with toluene to obtain a polymer solution containing 40% of an acrylic copolymer.

The resulting acrylic copolymer had a glass transition temperature of 130° C., an acid value of 120 (KOH mg/g), and a number-average molecular weight of 100,000.

1-6. Component [F]

Carboxy benzotriazole represented by the following formula (trade name "CBT-1" manufactured by Johoku Chemical Co., Ltd.) was used.

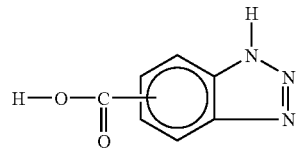

1-7. Component [G]

Dicumyl peroxide (trade name "PERCUMYL D" manufactured by NOF CORPORATION) was used as a thermal polymerization catalyst.

1-8. Other Component

Bisphenol-A type epoxy resin (trade name "EPIKOTE 828", manufactured by Japan Epoxy Resins Co., Ltd.) was used as component [H] for purposes of comparison with the component [A].

Ground silica (trade name "CRS2105", manufactured by Tatsumori Ltd.) was used as a filler (component [I]).

2,4-Diethylthioxanthone was used as a sensitizer (component [K]).

2. Preparation and Evaluation of Photosensitive Resin Composition Example 1

Components [A], [B], [C], [D], [G], [I], [K] described above and methylethylketone (solvent) were used in the ratios shown in Table 1. A photosensitive resin composition having a solids content of 65% was obtained by kneading with a triple roller mill.

The resulting composition was subjected to screen printing onto the surface of a board (copper clad laminate "ELC-4765", manufactured by SUMITOMO BAKELITE Co., Ltd.) that had been pre-treated, thereby forming a film having a thickness of 35 μm. Drying was then carried out at 100° C. for 10 minutes.

After that, the surface of the film produced in the above manner was exposed directly or via a photomask (light quantity 250 mJ/cm$^2$). Subsequently, sodium carbonate aqueous solution having a concentration of 1% was sprayed at a liquid temperature of 30° C. onto the surfaces of the exposed sections at a pressure of 1.5 kg/cm$^2$ for 60 seconds, thus performing alkali development by removing the unexposed sections. Post-curing was then performed at a temperature of 150° C. for 30 minutes to obtain a sample having a cured film.

The resulting sample was used, and evaluation was carried out according to following methods in regard to resolution, storage stability, substrate warpage, bending resistance, solder heat resistance and insulation reliability. The results are shown in Table 1.

(1) Resolution and Storage Stability

Samples that had been produced using photomasks having patterns with line widths of 80 μm, 100 μm, and 125 μm were observed using a microscope, and the condition of the cured films was evaluated.

○: Normal.

x: Abnormalities (e.g., residue, separation, deviation) were observed over the entire surface.

Additionally, in order to evaluate the storage stability of the photosensitive resin composition, samples were produced in the same manner as above after storage at 15° C. for 1 month, and the condition of the cured films was evaluated.

(2) Substrate Warpage 50 mm×50 mm×25 μm polyimide film (trade name "Kapton" manufactured by DU PONT-TORAY CO., LTD.) was used as a substrate and a cured film was formed in the same manner as above without using a photomask (hereinafter referred to as "sample Z"). The "substrate warpage" of this sample Z was determined by placing sample Z on a flat floor and measuring the elevation of the four corners of the sample Z from the floor. The average value was taken. A case where warpage could not be measured due to complete curling was denoted by (3) Bending Resistance The above-mentioned sample Z was used. The sample Z was bent at 180° so that the cured film was on the outside thereof, and the cured film was observed visually. Evaluations were made according to the following two levels.

○: No damage such as cracking was observed.

x: Cracking and white lines were observed.

(4) Solder Heat Resistance

The above-mentioned sample Z was used. The condition of the cured film was observed after 10 cycles, where one cycle involved immersion of the sample Z in a molten solder bath at a temperature of 260° C. for 10 seconds.

○: No separation from the substrate.

x: Separation of all or most of the cured film from the substrate.

(5) Insulation Reliability

A sample was produced under the same conditions as above, with the exception that a photomask for forming a cured film having a wedge-shaped test pattern (line width 100 μm, line separation 100 μm) was used. The sample was subjected to a direct current of 50 V in an atmosphere having a temperature of 85° C. and a humidity of 85% and the insulation resistance values after leaving for 250 hours, 500 hours and 1,000 hours were measured. A case where the resistance could be not measured due to short circuiting was denoted by "x".

Examples 2 to 3, Comparative Examples 1 to 3

The components described in Table 1 were used in various blend amounts, and the photosensitive resin compositions were prepared in the same manner as in Example 1. Evaluations were carried out, and the results were compiled in Table 1.

TABLE 1

|  |  |  | Example | | | Comparative Example | | |
|---|---|---|---|---|---|---|---|---|
|  |  |  | 1 | 2 | 3 | 1 | 2 | 3 |
| Formulation (parts) | [A] |  | 66 | 66 | 66 | 100 | 66 | 100 |
|  | [B] |  | 34 | 34 | 34 |  | 34 |  |
|  | [C] | (C-1) | 10 |  |  | 10 | 10 |  |
|  |  | (C-2) |  | 10 | 10 |  |  |  |
|  |  | (C-3) |  |  |  |  |  | 34 |
|  | [D] |  | 5 | 5 | 5 | 5 | 5 | 5 |
|  | [F] |  |  |  | 10 |  |  |  |
|  | [G] |  | 2 | 2 | 2 | 2 | 2 | 2 |
|  | [H] |  |  |  |  |  |  | 10 |
|  | [I] |  | 20 | 20 | 20 | 20 | 20 | 20 |
|  | [K] |  | 1 | 1 | 1 | 1 | 1 | 1 |
|  | Methylethylketone |  | 92 | 92 | 100 | 92 | 92 | 92 |
| Evaluation | Resolution and storage stability | Just after preparation | ○ | ○ | ○ | ○ | ○ | ○ |
|  |  | After 1 month storage | ○ | ○ | ○ | ○ | ○ | X |
|  | Substrate warpage (mm) |  | <10 | <10 | <10 | 20 | <10 | X |
|  | Bending resistance |  | ○ | ○ | ○ | X | ○ | X |
|  | Solder heat resistance |  | ○ | ○ | ○ | X | X | X |
|  | Insulation reliability (Ω) | After 250 hours | >$10^{12}$ | >$10^{12}$ | >$10^{12}$ | $10^{12}$ | $10^{10}$ | $10^{12}$ |
|  |  | After 500 hours | >$10^{12}$ | >$10^{12}$ | >$10^{12}$ | $10^9$ | $10^8$ | $10^9$ |
|  |  | After 1,000 hours | $10^{10}$ | $10^8$ | $10^8$ | $10^8$ | X | X |

As is clear from Table 1, the photosensitive resin compositions in Examples 1 to 3 had superior storage stability, substrate warpage of less than 10 mm, and were excellent in bending resistance, solder heat resistance and insulation reliability.

Comparative Example 1 was an example in which component [B] was not contained, on the other hand, the substrate warpage, bending resistance and solder heat resistance were inferior, and the insulation reliability decreased 500 hours later. Comparative Example 2 was an example in which component (C-3) was contained instead of component [B], and the solder heat resistance and insulation reliability were poor. Comparative Example 3 was an example in which component [H] (epoxy resin) was contained, but components [B] and [C] were not contained. The storage stability, substrate warpage, bending resistance and insulation reliability were inferior.

Examples 4 to 6 and Comparative Examples 4 to 5

The components listed in Table 2 were used in their respective blend amounts, and photosensitive resin compositions having a solids content of 65% were prepared in the same manner as in Example 1.

The resulting composition was subjected to screen printing onto the surface of a board (copper clad laminate "ELC-4765", manufactured by SUMITOMO BAKELITE Co., Ltd.) that had been pre-treated, thereby forming a film having a thickness of 35 µm. Drying was then carried out at 100° C. for 10 minutes. The surface condition of the coat film was visually observed in order to evaluate film-formability.

After that, the surface of the film produced in the above manner was exposed directly or via a photomask (light quantity 250 mJ/cm$^2$). Subsequently, sodium carbonate aqueous solution having a concentration of 1% was sprayed at a liquid temperature of 30° C. onto the surfaces of the exposed sections at a pressure of 1.5 kg/cm$^2$ for 60 seconds, thus performing alkali development by removing the unexposed sections. Post-curing was then performed at a temperature of 200° C. for 30 minutes to obtain a sample having a cured film.

Criteria for determining of the above-mentioned film-formability are as follows.

○: Coat film was good (usable as a photosensitive dry film).

x: Cissing and nonuniformity were observed (not usable as a photosensitive dry film).

In addition, the resulting sample was used, and evaluation was carried out in regard to resolution, storage stability, substrate warpage, bending resistance, solder heat resistance and insulation reliability. Further, evaluations were also carried out regarding particle levels generated from the cured film according to the following method. The results were compiled in Table 2.

A sample for the measurement of the particle level was used in which a cured film was formed on a polyimide film, as when producing sample Z in Example 1 above. The sample was immersed in ultra-pure water and sonicated for 10 minutes, whereupon the number of microparticles of 0.5 µm diameter or greater were measured using a particle counter ("RION KS-58" manufactured by RION Co., Ltd.).

were not contained, film-formability, substrate warpage, bending resistance, solder heat resistance and insulation reliability were inferior. In addition, Comparative example 5 was an example in which components (C-3) and [H] (epoxy resin) were contained, but components [B] and [D] were not contained. The film-formability, resolution, storage stability, substrate warpage and bending resistance were inferior, and the insulation reliability decreased 500 hours later.

INDUSTRIAL APPLICABILITY

The photosensitive resin composition of the present invention can be used for a coating agent such as a paint; an ink; a resist; a molding material; and the like. In particular, it is suitable as a resist film forming material, an insulating material or a solder resist film forming material, and is useful for flexible printed circuit boards (FPC boards) and suspension substrates for hard-disc.

What is claimed is:

1. A photosensitive resin composition comprising:
   [A] a compound having a carbon-carbon unsaturated double bond and carboxyl group, which is obtained by allowing a bisphenol type epoxy compound and an unsaturated monocarboxylic acid to react, and then allowing a polybasic acid anhydride to undergo addition reaction with part or all of secondary hydroxyl groups of the reaction product;
   [B] a urethane (meth)acrylate compound having a structure derived from a polycarbonate-polyol structure, wherein said urethane (meth)acrylate compound [B] has no carboxyl groups;

TABLE 2

|  |  |  | Example | | | Comparative Example | |
|---|---|---|---|---|---|---|---|
|  |  |  | 4 | 5 | 6 | 4 | 5 |
| Formulation (parts) | [A] |  | 66 | 66 | 66 | 100 | 66 |
|  | [B] |  | 34 | 34 | 34 |  |  |
|  | [C] | (C-1) | 10 |  | 10 | 10 | 10 |
|  |  | (C-2) |  | 10 |  |  |  |
|  |  | (C-3) |  |  |  |  | 34 |
|  | [D] |  | 5 | 5 | 5 | 5 | 5 |
|  | [E] |  | 10 | 10 |  |  |  |
|  | [G] |  | 2 | 2 | 2 | 2 | 2 |
|  | [H] |  |  |  |  |  | 10 |
|  | [I] |  |  |  | 30 |  |  |
|  | [K] |  | 1 | 1 | 1 | 1 | 1 |
|  | Methylethylketone |  | 85 | 85 | 100 | 79 | 85 |
| Evaluation | Film-formability |  | ○ | ○ | ○ | X | X |
|  | Resolution and | Just after preparation | ○ | ○ | ○ | ○ | ○ |
|  | storage stability | After 1 month storage | ○ | ○ | ○ | ○ | X |
|  | Substrate warpage (mm) |  | <10 | <10 | <10 | 20 | X |
|  | Bending resistance |  | ○ | ○ | X | X | X |
|  | Solder heat resistance |  | ○ | ○ | ○ | X | ○ |
|  | Insulation | After 250 hours | >10$^{12}$ | >10$^{12}$ | 10$^{11}$ | 10$^{12}$ | 10$^{12}$ |
|  | reliability | After 500 hours | >10$^{12}$ | >10$^{12}$ | 10$^{10}$ | 10$^9$ | 10$^8$ |
|  | (Ω) | After 1,000 hours | 10$^{11}$ | 10$^9$ | 10$^9$ | 10$^8$ | X |
|  | Particles (/cm$^2$) |  | <10,000 | <10,000 | 25,000 | <10,000 | <10,000 |

As is clear from Table 2, the photosensitive resin compositions of Examples 4 and 5 had superior film-formability and storage stability, substrate warpage of less than 10 mm, and the bending resistance, solder heat resistance and insulation reliability were excellent. In addition, particles produced were less than 10,000.

On the other hand, in the photosensitive resin composition of Comparative Example 4 in which components [B] and [D]

[C] a polymerizable compound having a carbon-carbon unsaturated double bond; and
   [D] a photopolymerization initiator.

2. The photosensitive resin composition according to claim 1, wherein said polymerizable compound [C] has three or more (meth)acryloyl groups.

3. The photosensitive resin composition according to claim 1, further comprising a polymer [E] comprising a unit derived from at least one compound selected from the group consisting of (meth)acrylic acid and a (meth)acrylic acid ester.

4. The photosensitive resin composition according to claim 3, wherein glass transition temperature of said polymer [E] is in the range from 40° C. to 150° C.

5. The photosensitive resin composition according to claim 1, further comprising a compound [F] represented by the following general formula (1):

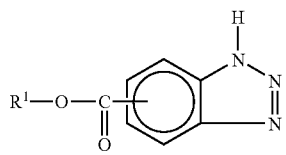
(1)

wherein $R^1$ is selected from the group consisting of a hydrogen atom, an alkali metal atom, an alkyl group having 1-6 carbon atoms, and an ammonium ion.

6. A composition for a solder resist comprising the photosensitive resin composition according to claim 1.

7. A photosensitive dry film comprising a supporting layer and a photosensitive layer which is disposed on said supporting layer and is formed using the photosensitive resin composition according to claim 1.

* * * * *